(12) United States Patent
Sogo

(10) Patent No.: US 11,626,706 B2
(45) Date of Patent: *Apr. 11, 2023

(54) METHOD OF MANUFACTURING OPTICAL MEMBER, OPTICAL MEMBER, AND LIGHT EMITTING DEVICE

(71) Applicant: NICHIA CORPORATION, Anan (JP)

(72) Inventor: Takayuki Sogo, Anan (JP)

(73) Assignee: NICHIA CORPORATION, Anan (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/526,587

(22) Filed: Nov. 15, 2021

(65) Prior Publication Data

US 2022/0077650 A1 Mar. 10, 2022

Related U.S. Application Data

(63) Continuation of application No. 16/815,653, filed on Mar. 11, 2020, now Pat. No. 11,205,886.

(30) Foreign Application Priority Data

Mar. 12, 2019 (JP) .............................. JP2019-045290
Feb. 5, 2020 (JP) .............................. JP2020-017590

(51) Int. Cl.
*H01S 5/024* (2006.01)
*H01S 5/06* (2006.01)
(Continued)

(52) U.S. Cl.
CPC ........ *H01S 5/02438* (2013.01); *H01S 5/0087* (2021.01); *H01S 5/02257* (2021.01);
(Continued)

(58) Field of Classification Search
CPC ...... H01S 5/0087; H01S 5/0092; H01S 5/005; H01S 5/02208–02216;
(Continued)

(56) References Cited

U.S. PATENT DOCUMENTS 9,529,134 B2 * 12/2016 Morizumi ................. F21V 9/32
10,658,811 B2 * 5/2020 Miura ....................... F21V 7/04
(Continued)

FOREIGN PATENT DOCUMENTS

CN          1860652 A  * 11/2006  ............... G02B 1/18
CN      110325884 A  * 10/2019  ............ C04B 35/115
(Continued)

OTHER PUBLICATIONS

Notice of Allowance dated Aug. 18, 2021 as issued in related U.S. Appl. No. 16/815,653.

*Primary Examiner* — Joshua King
(74) *Attorney, Agent, or Firm* — Foley & Lardner LLP

(57) ABSTRACT

An optical member includes: a main body having transparency or heat dissipation properties; an optical film disposed on an upper face of the main body; a metal film disposed on the upper face of the main body in a region other than a region where the optical film is disposed; a surrounding part joined via the metal film; and a wavelength conversion part surrounded by the surrounding part. The wavelength conversion part is positioned inward of a periphery of the optical film in a top view. The wavelength conversion part is not directly bonded to the optical film and the main body.

16 Claims, 10 Drawing Sheets

(51) Int. Cl.
  *H01S 5/02257*  (2021.01)
  *H01S 5/00*  (2006.01)
  *H01S 5/02216*  (2021.01)
  *H01S 5/40*  (2006.01)

(52) U.S. Cl.
  CPC .......... *H01S 5/0609* (2013.01); *H01S 5/0071* (2013.01); *H01S 5/0078* (2013.01); *H01S 5/02216* (2013.01); *H01S 5/4056* (2013.01)

(58) Field of Classification Search
  CPC . H01S 5/042438–02446; H01S 5/0078; H01S 5/02257; H01S 5/0064; F21V 9/32–45; F21V 9/20; F21K 9/64; F21K 9/65
  See application file for complete search history.

(56) References Cited

U.S. PATENT DOCUMENTS

| | | | |
|---|---|---|---|
| 10,978,852 B2 * | 4/2021 | Kitajima | H01S 5/005 |
| 2009/0003400 A1 * | 1/2009 | Nagahama | H01L 33/483 372/50.23 |
| 2010/0246159 A1 * | 9/2010 | Wada | F21K 9/00 257/E21.599 |
| 2012/0039072 A1 * | 2/2012 | Lell | H04N 9/3161 362/259 |
| 2013/0264937 A1 * | 10/2013 | Sakuta | H05B 33/12 313/503 |
| 2014/0153276 A1 * | 6/2014 | Nozaki | F21S 41/16 362/520 |
| 2014/0268787 A1 * | 9/2014 | Nozaki | H01S 3/005 362/259 |
| 2014/0369064 A1 * | 12/2014 | Sakaue | F21K 9/61 362/553 |
| 2015/0077972 A1 * | 3/2015 | Sugiyama | H01S 5/02257 362/553 |
| 2015/0085262 A1 * | 3/2015 | Ogura | F21V 9/40 362/326 |
| 2015/0188004 A1 * | 7/2015 | Ozeki | H01L 33/508 438/27 |
| 2015/0292687 A1 * | 10/2015 | Sugiyama | H01S 5/02212 362/259 |
| 2015/0372198 A1 * | 12/2015 | Daicho | H01S 5/02469 372/44.01 |
| 2015/0372200 A1 * | 12/2015 | Seko | F21S 41/16 362/510 |
| 2016/0091171 A1 * | 3/2016 | Okada | F21V 9/38 372/44.01 |
| 2016/0093761 A1 * | 3/2016 | Parsa | H01L 31/167 257/433 |
| 2016/0131314 A1 * | 5/2016 | Waragaya | H01S 5/0087 372/45.01 |
| 2016/0369954 A1 * | 12/2016 | Anc | H01L 33/508 |
| 2017/0023188 A1 * | 1/2017 | Mima | C09K 11/02 |
| 2017/0122505 A1 * | 5/2017 | Kiyota | F21V 5/04 |
| 2017/0284634 A1 * | 10/2017 | Kiyota | H01S 5/0087 |
| 2017/0317469 A1 * | 11/2017 | Kiyota | H01S 5/02345 |
| 2017/0345984 A1 * | 11/2017 | Yamashita | H01L 33/507 |
| 2018/0087726 A1 * | 3/2018 | Yamashita | H01S 5/02255 |
| 2018/0149954 A1 * | 5/2018 | Akiyama | G03B 21/16 |
| 2018/0252372 A1 * | 9/2018 | Noguchi | C09K 11/7706 |
| 2018/0347785 A1 * | 12/2018 | Kawaguchi | F21V 13/08 |
| 2019/0081452 A1 * | 3/2019 | Miura | H01S 5/02255 |
| 2019/0097095 A1 * | 3/2019 | Yamanaka | F21V 13/14 |
| 2019/0148909 A1 * | 5/2019 | Kuroda | H01S 5/0235 372/44.01 |
| 2019/0199052 A1 * | 6/2019 | Miyoshi | H01S 5/0087 |
| 2019/0219233 A1 * | 7/2019 | Morimoto | F21V 9/45 |
| 2019/0242548 A1 * | 8/2019 | Hiroi | H01S 5/00 |
| 2019/0305512 A1 * | 10/2019 | Kitajima | H01S 5/0087 |
| 2020/0049911 A1 * | 2/2020 | Tsai | H01S 5/06825 |
| 2020/0056751 A1 * | 2/2020 | Sugiyama | F21S 41/176 |
| 2020/0332984 A1 * | 10/2020 | Yamashita | H01L 33/505 |

FOREIGN PATENT DOCUMENTS

| | | | | |
|---|---|---|---|---|
| CN | 112086853 A | * | 12/2020 | ......... G03B 21/2006 |
| EP | 1727249 B1 | * | 2/2014 | .............. G02B 1/18 |
| EP | 3 598 184 A1 | | 1/2020 | |
| EP | 3598184 A1 | * | 1/2020 | .............. F21K 9/64 |
| FR | 3051887 A1 | * | 12/2017 | .............. F21K 9/64 |
| JP | 2004-128273 A | | 4/2004 | |
| JP | 2004128273 A | * | 4/2004 | ......... H01S 5/02292 |
| JP | 2015-060871 A | | 3/2015 | |
| JP | 2016-009693 A | | 1/2016 | |
| JP | 2016-009761 A | | 1/2016 | |
| JP | 2016009693 A | * | 1/2016 | ......... F21S 48/1145 |
| JP | 2016-092364 A | | 5/2016 | |
| JP | 2016092364 A | * | 5/2016 | .............. F21K 9/56 |
| JP | 2017-085036 A | | 5/2017 | |
| JP | 2017085036 A | * | 5/2017 | .............. F21K 9/64 |
| JP | 2017-199849 A | | 11/2017 | |
| JP | 2017199849 A | * | 11/2017 | .............. F21K 9/64 |
| JP | 2018-054900 A | | 4/2018 | |
| JP | 2018-087918 A | | 6/2018 | |
| JP | 2018-088307 A | | 6/2018 | |
| JP | 2019-009406 A | | 1/2019 | |
| WO | WO-2007/105647 A1 | | 9/2007 | |
| WO | WO-2007105647 A1 | * | 9/2007 | ......... H01L 33/483 |
| WO | WO-2013/113547 A1 | | 8/2013 | |
| WO | WO-2013113547 A1 | * | 8/2013 | .............. G02F 1/00 |
| WO | WO-2017/068766 A1 | | 4/2017 | |
| WO | WO-2017068766 A1 | * | 4/2017 | ......... G02B 19/0014 |
| WO | WO-2019/131439 A1 | | 7/2019 | |
| WO | WO-2019131439 A1 | * | 7/2019 | ........... H01S 5/0087 |
| WO | WO-2019/174969 A1 | | 9/2019 | |
| WO | WO-2019174969 A1 | * | 9/2019 | .............. F21S 41/16 |

* cited by examiner

METHOD OF MANUFACTURING OPTICAL MEMBER, OPTICAL MEMBER, AND LIGHT EMITTING DEVICE

CROSS-REFERENCE TO RELATED APPLICATIONS

This application is continuation of U.S. patent application Ser. No. 16/815,653, filed on Mar. 11, 2020, which claims priority to Japanese Patent Application No. 2019-045290, filed on Mar. 12, 2019, and Japanese Patent Application No. 2020-017590 filed on Feb. 5, 2020, the disclosures of which are hereby incorporated by reference in their entireties.

BACKGROUND

The present disclosure relates to a method of manufacturing an optical member, an optical member, and a light emitting device having an optical member.

Japanese Patent Publication No. 2015-60871 discloses a light emitting device in which the laser light emitted from a semiconductor laser element enters a phosphor member and the fluorescent light emitted by the phosphor member is reflected by a filter. As disclosed in this patent publication, an optical filter such as a dielectric multilayer film can be utilized for efficiently extracting wavelength-converted light.

SUMMARY

In the case of efficiently extracting light from a wavelength conversion member by utilizing optical characteristics, such as reflection and transmission, it is important to consider layouts and shapes.

According to one embodiment, a method of manufacturing an optical member comprises: providing a light transmissive member or a heat dissipating member in which a metal film and an optical film having a larger thickness than a thickness of the metal film are formed in separate regions of an upper face of a main body of the light transmissive member or an upper face of a main body of the heat dissipating member, providing a wavelength conversion member in which a metal film is formed on a lower face of a main body of the wavelength conversion member, and bonding the metal film of the light transmissive member or the metal film of the heat dissipating member and the metal film of the wavelength conversion member via a metal adhesive while positioning an optical film directly under a wavelength conversion part of the wavelength conversion member.

According to another embodiment, an optical member comprises: a main body having transparency or heat dissipation properties; an optical film disposed on an upper face of the main body; a metal film disposed on the upper face of the main body in a region other than a region where the optical film is disposed; a surrounding part joined via the metal film; and a wavelength conversion part surrounded by the surrounding part. The wavelength conversion part is positioned inward of a periphery of the optical film as seen from the top. The wavelength conversion part is not directly bonded to the optical film and the main body.

According to another embodiment, a light emitting device comprises: a semiconductor laser element; and the optical member described above. The optical member is configured to receive light emitted from the semiconductor laser element.

Certain embodiments of the present disclosure can achieve an optical member capable of efficiently extracting light. Furthermore, the present disclosure can achieve a light emitting device that enables efficient light extraction.

DETAILED DESCRIPTION

Figure 1:
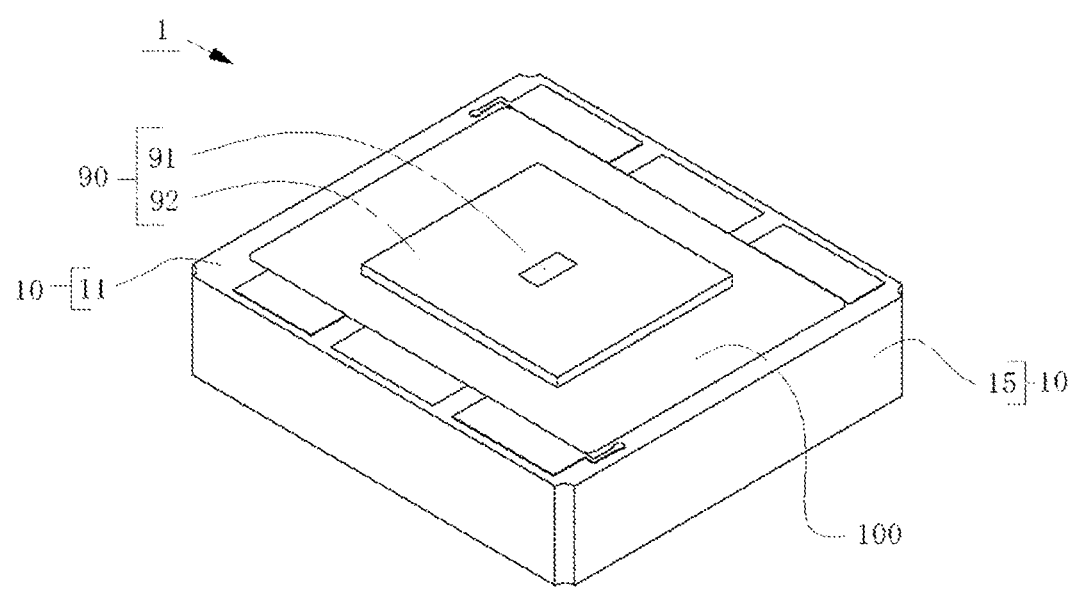
FIG. 1 is a perspective view of a light emitting device according to a first embodiment of the present disclosure.

In the description and the accompanying claims, a polygon, such as a triangle, square, or the like, should be interpreted to encompass a polygon subjected to processing, such as cutting angles, beveling, chamfering, rounding, or the like. Moreover, the location of such processing is not limited to a corner (an end of a side). Rather, a polygon should similarly be interpreted to encompass subjected to processing in the middle of a side. In other words, any polygon-based shape subjected to processing should be understood to be included in the interpretation of a "polygon" in the description and accompanying claims.

This similarly applies to any word describing a specific shape, such as a trapezoidal, circular, recessed, or projected shape, without being limited to a polygon. In other words, even if a corner or middle of a side is subjected to processing, the term "side" should be interpreted to include the processed portion. To distinguish a "polygon" or "side" that is intentionally not processed from a shape subjected to processing, the shape will be described by adding the phrase "strict-sense," such as "a strict-sense square."

Moreover, in the description and accompanying claims, when there are plurality of pieces of a certain constituent element and a distinction must to be made, a word such as "first," "second," or the like might occasionally be added. The manner in which such a word is used in the description might not match the manner in which such a word is used in the claims if the subject to be distinguished or the perspective for such a distinction differs.

Certain embodiments of the present disclosure will be explained below with reference to the drawings. The embodiments described below are provided to give shape to the technical ideas of the present invention, and are not intended to limit the present invention. In the explanation below, the same designations and reference numerals denote the same or similar members, and redundant explanations will be omitted as appropriate. The sizes and relative positions of the members shown in the drawings might be exaggerated for clarity of explanation.

First Embodiment

Figure 2:
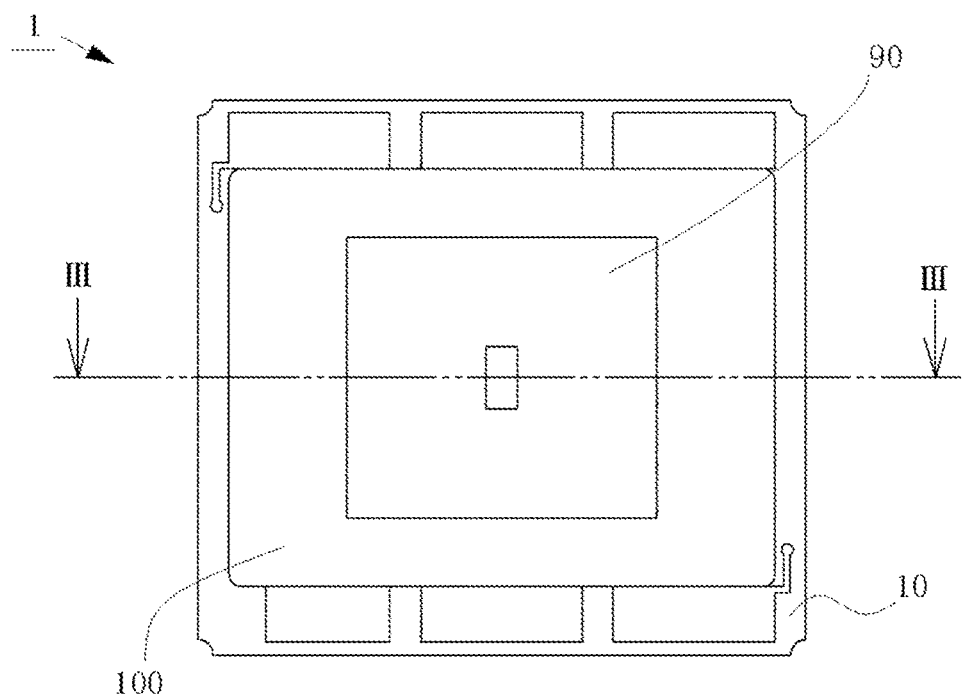
FIG. 2 is a top view corresponding to FIG. 1.
Figure 3:
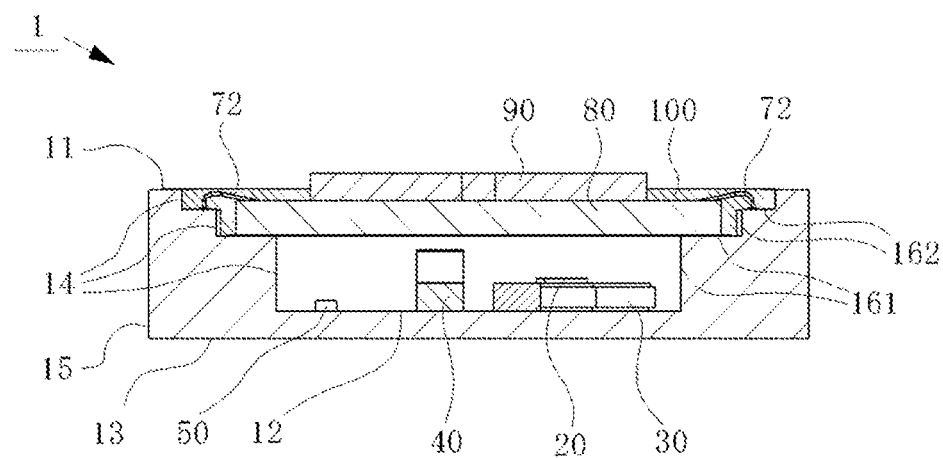
FIG. 3 is a cross-sectional view of the light emitting device taken along line in FIG. 2.
Figure 4:
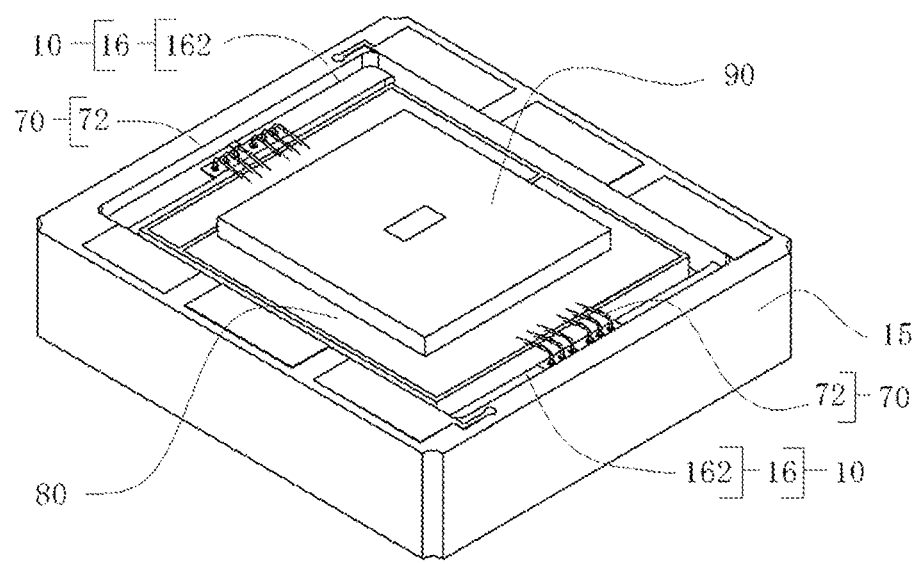
FIG. 4 is a perspective view showing the internal structure of the light emitting device according to the first embodiment.
Figure 5:
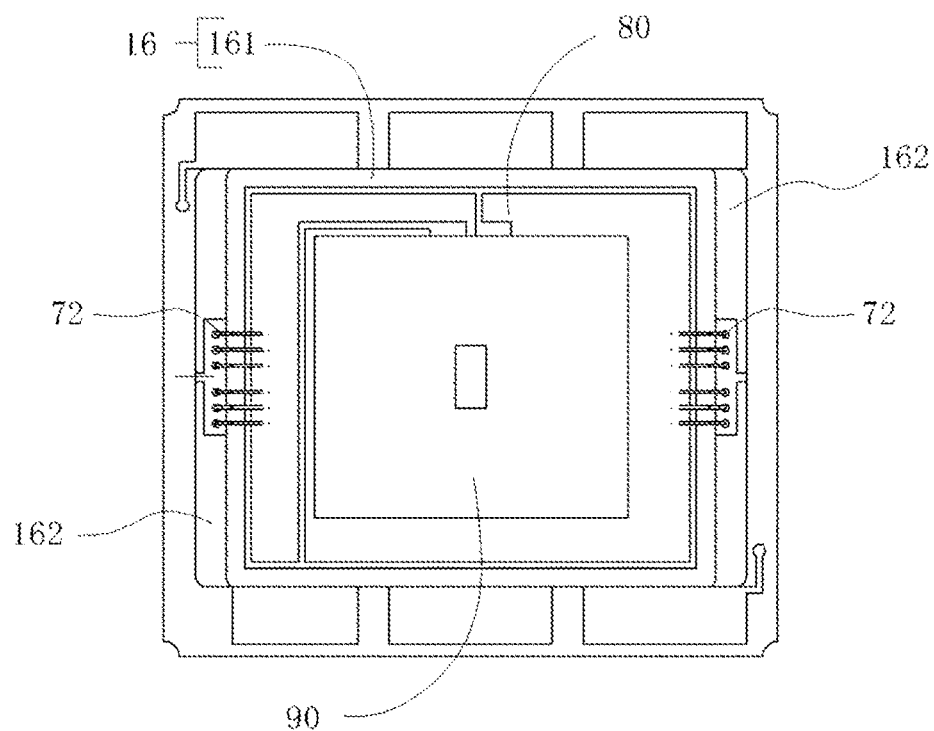
FIG. 5 is a top view corresponding to FIG. 4.
Figure 6:
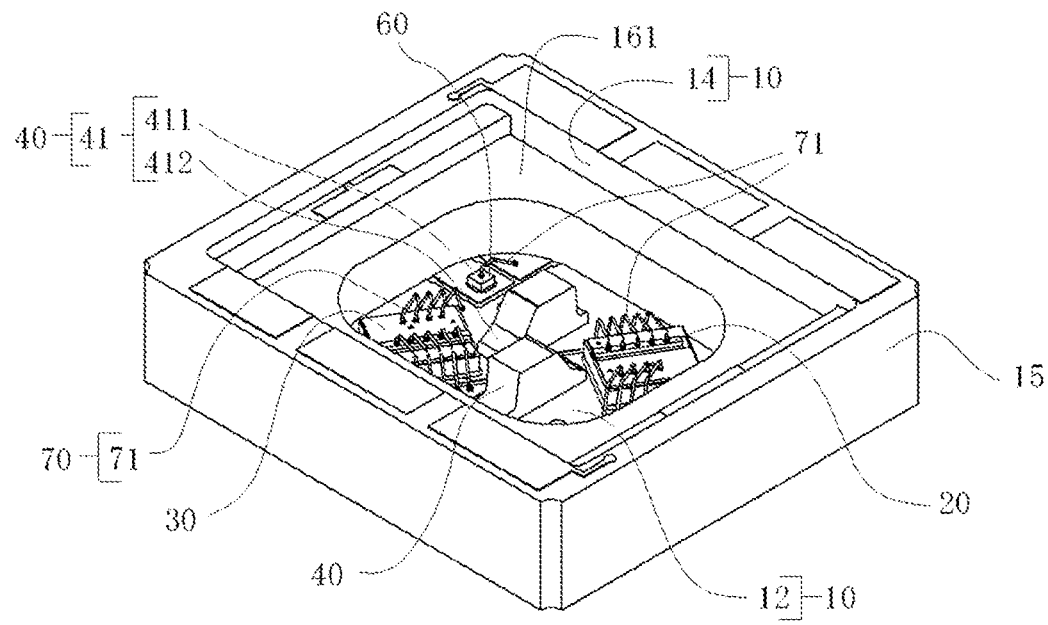
FIG. 6 is a perspective view showing the internal structure of the light emitting device according to the first embodiment.
Figure 7:
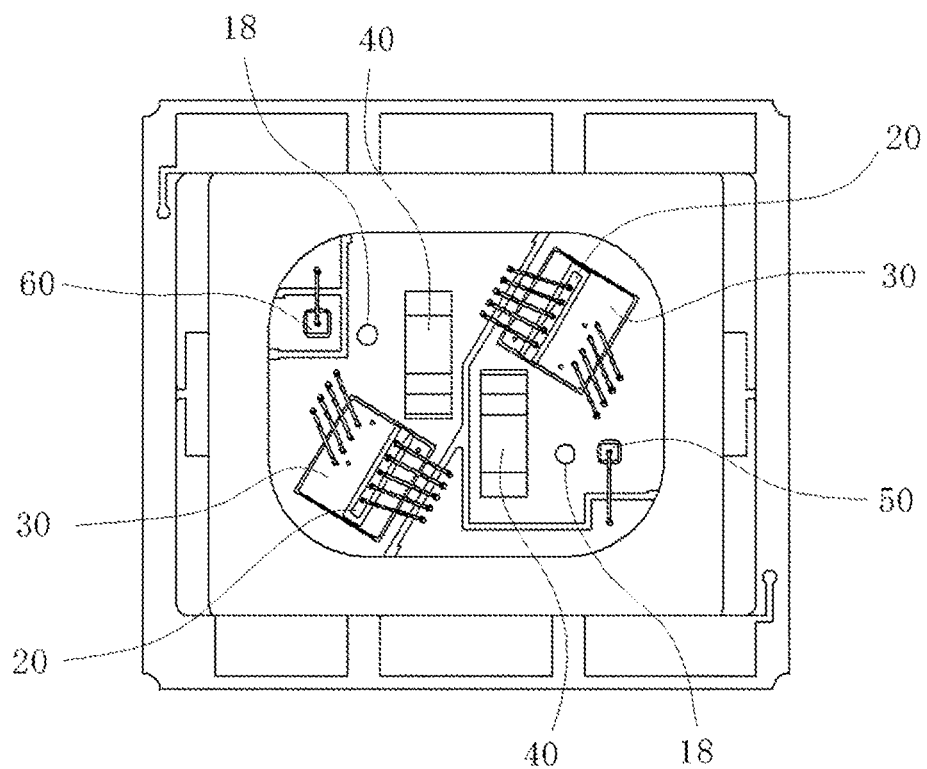
FIG. 7 is a top view corresponding to FIG. 6.
Figure 8:
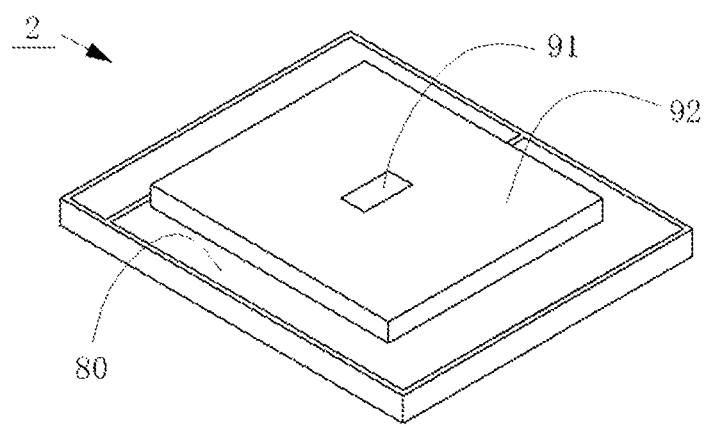
FIG. 8 is a perspective view of an optical member according to one embodiment.
Figure 9:
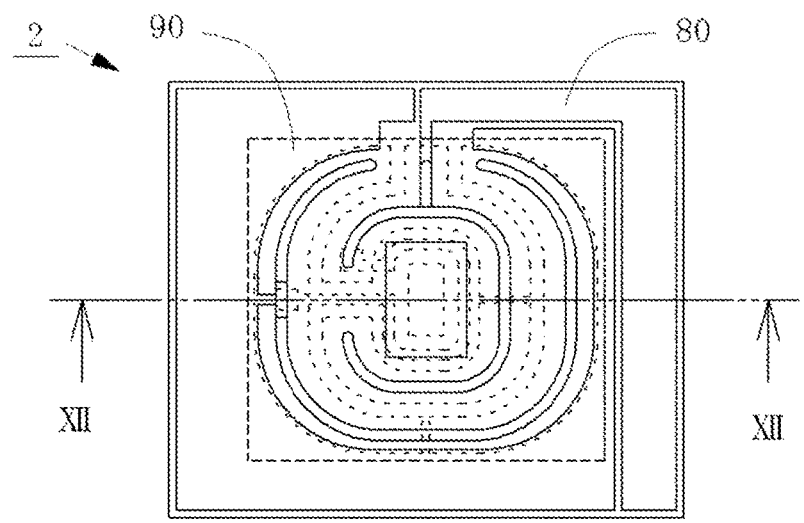
FIG. 9 is a top view corresponding to FIG. 8 showing the interface between the light transmissive member and the wavelength conversion member as seen through the wavelength conversion member.
Figure 10:
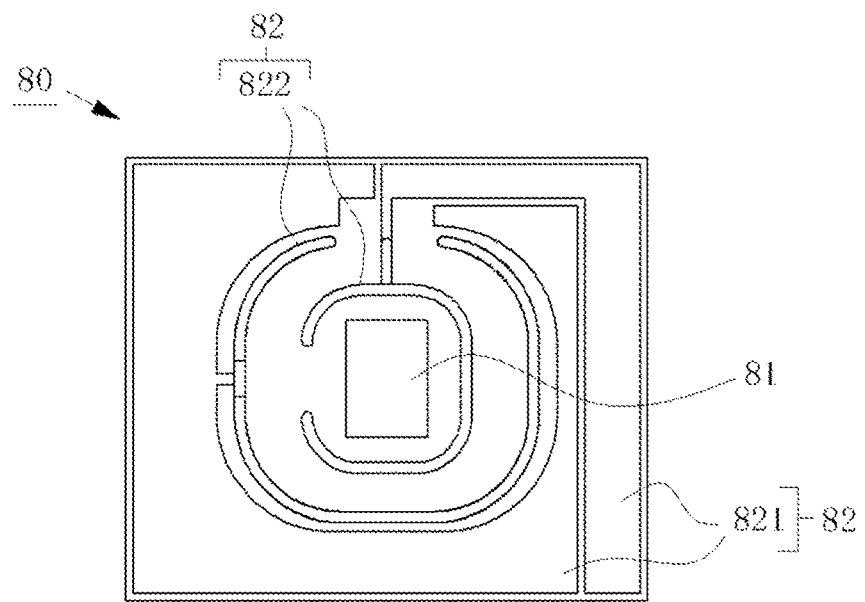
FIG. 10 is a top view of the light transmissive member according to the first embodiment.
Figure 11:
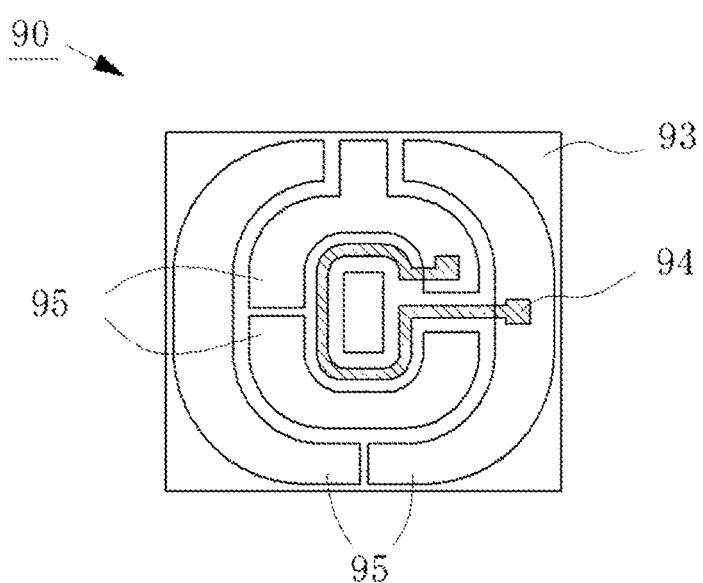
FIG. 11 is a bottom view of the wavelength conversion member according to the first embodiment.
Figure 12:
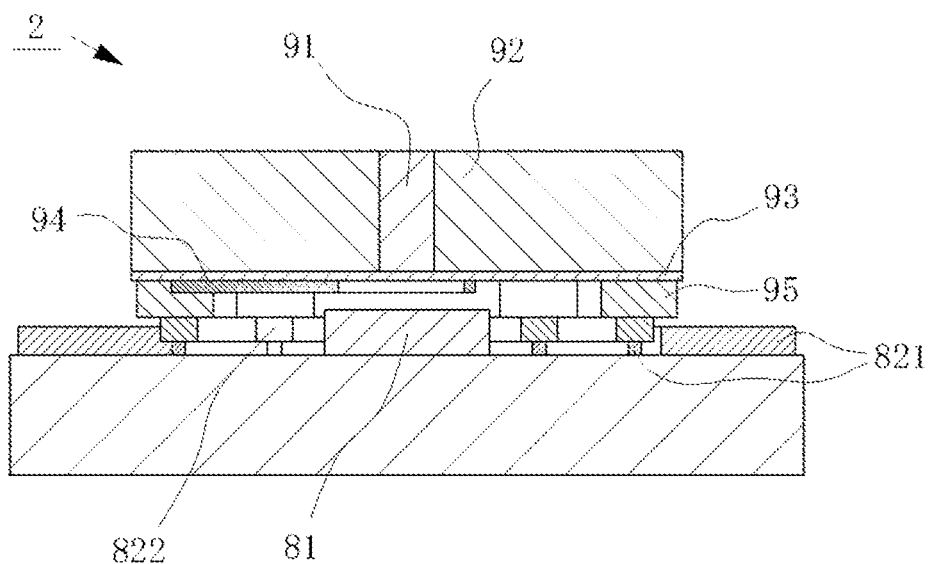
FIG. 12 is a cross-sectional view of the optical member taken along line XII-XII in FIG. 9.
Figure 13:
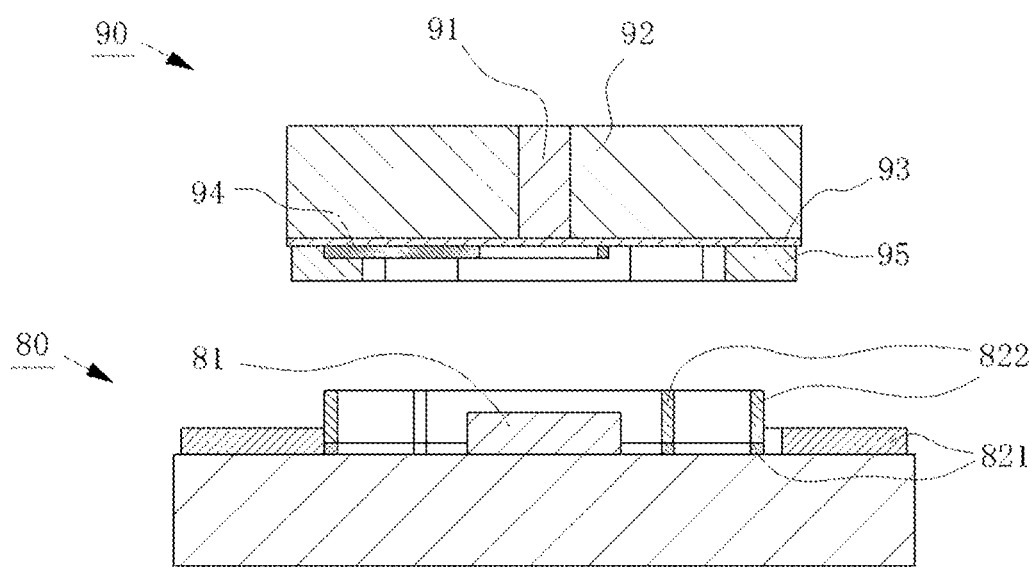
FIG. 13 is a cross-sectional view corresponding to FIG. 12 showing the state prior to bonding the light transmissive member and the wavelength conversion member.

FIG. 1 is a perspective view of a light emitting device 1 according to a first embodiment. FIG. 2 is a top view of the light emitting device 1. FIG. 3 is a cross-sectional view of the light emitting device 1 taken along line in FIG. 2. FIG. 4 is a perspective view showing the state in which the light shielding member 100 is removed from the light emitting device 1 to explain the internal structure. FIG. 5 is a top view in a similar state to that in FIG. 4. FIG. 6 is a perspective view showing the state in which the optical member 2 according to the first embodiment is further removed from the light emitting device 1 to explain the internal structure. FIG. 7 is a top view in a similar state to that in FIG. 6. FIG. 8 is a perspective view of the optical member 2. FIG. 9 is a top view in a similar state to that in FIG. 8, where the interface between the light transmissive member 80 and the wavelength conversion member 90 is seen through the wavelength conversion member 90. In FIG. 9, the periphery of the wavelength conversion member 90 is indicated by a broken line, and the portion constituting the wavelength conversion member 90 is indicated by dotted lines. FIG. 10 is a top view of the light transmissive member 80. FIG. 11 is a bottom view of the wavelength conversion member 90. In FIG. 11, the hatched part represents the conductive film 94 of the wavelength conversion member 90. FIG. 12 is a cross-sectional view of the optical member 2 taken along line XII-XII in FIG. 90. FIG. 13 is a cross-sectional view in the state prior to bonding the light transmissive member 80 and the wavelength conversion member 90.

The light emitting device 1 has, as constituent elements, a base 10, two semiconductor laser elements 20, two submounts 30, two light reflecting members 40, a protective device 50, a temperature measuring element 60, wiring 70, a light transmissive member 80, a wavelength conversion member 90, and a light shielding member 100.

Base 10

The base 10 has a recessed shape that is indented from the upper face to the lower face. As seen from the top, the periphery is a quadrilateral and the recess is formed inward of the periphery. The base 10 has an upper face 11, a bottom face 12, a lower face 13, inner lateral faces 14, and outer lateral faces 15 where the inner lateral faces 14 and the bottom face 12 create the indented space. As seen from the top, the inner lateral faces 14 intersecting the upper face 11 form a quadrilateral frame that surrounds the indented space.

The base 10 also has two stepped portions 16 inward of the frame. Here, the stepped portions 16 refer to the portions each made up of an upper face and lateral faces intersecting the upper face and extending downward therefrom. Accordingly, the inner lateral faces 14 of the base 10 include the lateral faces intersecting the upper face 11 of the base 10 and the lateral faces of the stepped portions.

Here, the two stepped portions 16 are, from the one closer to the bottom face 12, referred to as a first stepped portion 161 and a second stepped portion 162. The base 10 does not have to have two stepped portions 16. For example, it may have one stepped portion 16.

An intersection of two faces can be identified in the drawings. For example, the outer lateral faces 15 can be said to intersect with the upper face 11 and the lower face 13. In another example, the upper face of the first stepped portion 161 can be said to intersect with the lateral faces of the second stepped portion 162 extending upward from the upper face at one end while intersecting with the lateral faces that intersect with the upper face 11 at the other end. The same applies to an intersection of two sides.

The base 10 can be formed using a ceramic as a main material. For example, aluminum nitride, silicon nitride, aluminum oxide, or silicon carbide can be used as a ceramic material. The base 10 may be formed by using an insulation material as a main material besides a ceramic material.

A plurality of pieces of metal film are disposed on the base 10. Six pieces of metal film are disposed on the upper face 11, five on the bottom face 12, and two on the upper face of the second stepped portion 162 of the base 10. Four pieces of metal film disposed on the bottom face 12 and the two pieces of metal film on the upper face of the second stepped portion 162 are each linked to one of the six pieces of metal film disposed on the upper face 11 via the metal that runs through the base 10. A metal film is also disposed on the upper face of the first stepped portion 161.

The regions (locations) where the metal film is disposed or the number thereof are not limited to those described above. The number of locations where the metal film is disposed on the upper face 11 and the bottom face 12 may be changed. For example, the metal film can be disposed on the lower face 13 instead of the upper face 11. In the case of the light emitting device 1, a plurality of pieces of metal film can be said to be disposed on the bottom face 12 of the base 10, the upper face of the second stepped portion 162, and the upper face 11 of the base 10.

Semiconductor Laser Element 20

The semiconductor laser element 20 has a rectangular periphery as seen from the top. The lateral face intersecting with one of the two short sides of the rectangle serves as the light exiting face of a semiconductor laser element 20. The upper face and the lower face of a semiconductor laser element 20 are larger in area than the light exiting face.

The light emitted from a semiconductor laser element (laser light) is divergent, creating an elliptical far field pattern (hereinafter referred to as "FFP") in a plane paralleling the light exiting face. Here, the FFP represents the shape and light intensity distribution of the emitted light at a distant position from the light exiting face.

The shape of the FFP of the emitted light from a semiconductor laser element 20 is an ellipse having a longer diameter in the stacking direction of the semiconductor layers including the active layer than a diameter in the layer direction perpendicular to the stacking direction of the semiconductor layers. In the FFP, the layer direction will be referred to as the lateral direction of the FFP, and the direction parallel to the stacking direction will be referred to as the vertical direction of the FFP.

The portion of the light having an intensity of $1/e^2$ and values higher than $1/e^2$ relative to the peak intensity value based on the light intensity distribution of the FFP of a semiconductor laser element 20 will be referred to as the major portion of light. The angle corresponding to the full width at half maximum of the light intensity distribution will be referred to as a divergence angle. The divergence angle of the FFP in the vertical direction will be referred to as the vertical divergence angle, and the divergence angle of the FFP in the lateral direction will be referred to as the lateral divergence angle.

For a semiconductor laser element 20, a blue light emitting semiconductor laser element can be employed, for example. Here, blue light refers to the light having a peak emission wavelength in the range of 420 nm to 494 nm. An example of a blue light emitting semiconductor laser element is a semiconductor laser element that includes a nitride semiconductor. For the nitride semiconductor, for example, GaN, In, InGaN, and AlGaN can be used.

Submount 30

The submount 30 is in the form of a parallelepiped having a lower face, an upper face, and lateral faces. The submount 30 has the smallest width in the up/down direction. The shape of the submount 30 is not necessarily limited to a parallelepiped. The submount 30 is formed of, for example, silicon nitride, aluminum nitride, or silicon carbide. Other materials may alternatively be used. A metal film is disposed on the upper face of a submount 30.

Light Reflecting Member 40

The light reflecting member 40 has two light reflecting faces 41 that reflect light. Each light reflecting face 41 is provided with a surface having a reflectivity of at least 99% for the peak wavelength of incident light. The reflectivity here can be set to 100% at most, or less than 100%.

The two light reflecting faces 41 are respectively flat and oblique to the lower face, and the oblique angles formed by the faces with the lower face differ from one another. In other words, the two light reflecting faces 41 are neither perpendicular nor parallel to the lower face. The two light reflecting faces 41 are contiguous, forming an integral reflecting region.

Here, the light reflecting face closer to the lower face will be referred to as the first reflecting face 411, and the other light reflecting face farther to the lower face will be referred to as the second reflecting face 412. In a light reflecting member 40, the oblique angle of the second reflecting face 412 is larger than the oblique angle of the first reflecting face 411, where the oblique angle is an angle by which the light reflecting face is inclined with respect to the lower face of the light reflecting member 40. For example, the difference between the oblique angle of the first reflecting face 411 and the oblique angle of the second reflecting face 412 is in a range of 10 to 60 degrees.

The light reflecting member may have three or more light reflecting faces 41 that form an integral reflecting region. It may form a reflecting region with a single light reflecting face 41. It may further have another light reflecting face that is not contiguous. Moreover, a light reflecting face 41 may have a curved shape instead of a planar shape.

Glass or metal can be used as a main material to form the exterior of the light reflecting members 40. A heat resistant material is preferable for the main material. For example, glass such as quartz or BK7 (borosilicate glass), metals such as aluminum, or Si can be used. The light reflecting faces can be formed of, for example, metals such as Ag, Al, or the like, or a dielectric multilayer film such as $Ta_2O_5/SiO_2$, $TiO_2/SiO_2$, $Nb_2O_5/SiO_2$, or the like.

Protective Device 50

The protective device 50 is something that prevents a certain element (e.g., a semiconductor laser element) from being destroyed by excess current. For the protective device 50, a Zener diode formed with Si, for example, can be used.

Temperature Measuring Element 60

The temperature measuring element 60 is an element utilized as a temperature sensor for measuring the ambient temperature. For the temperature measuring element 60, a thermistor, for example, can be used.

Wiring 70

The wiring 70 is used to electrically connect a certain element (e.g., a semiconductor laser element). For the wiring 70, a metal wire, for example, can be used.

Light Transmissive Member 80

The light transmissive member 80 is a plate-like parallelepiped having a lower face, upper face, and lateral faces. The light transmissive member has transparency and transmits light. Here, "having transparency" is defined as a luminous transmittance of at least 80%. The shape of the light transmissive member is not limited to a parallelepiped.

The light transmissive member 80 can be formed by using sapphire as a main material. Sapphire has a relatively high refractive index and relatively high strength. Besides sapphire, quartz, silicon carbide, glass, or the like can be used.

The upper face of the light transmissive member 80 includes an optical film 81 and two metal films 82. On the lower face of the light transmissive member 80, an anti-reflective film (AR film) and a metal film are disposed. Metal films 82 on the upper face and the metal film on the lower face are disposed in the peripheral regions of corresponding face. Accordingly, the light transmissive member 80 has, as seen from the top or bottom, a region having transparency and a region having no transparency. The region having transparency is located in the central portion.

The optical film 81 forms a reflecting film that reflects light having a specific wavelength, while forming a light transmitting film that transmits light having other wavelengths. In other words, the optical film 81 can be said to have both optical properties of reflection and transmission, i.e., the optical film has the varying properties depending on the wavelength. The optical film 81 functions as an optical filter that reflects or transmits light of a specific wavelength. Examples of an optical film 81 include a DBR (distributed Bragg reflector). It may be an optical film having either of the optical properties, i.e., it may be a reflecting film or a light transmitting film.

The anti-reflective film is disposed to restrain the light entering the lower face of the light transmissive member 80 from being reflected by the lower face. The anti-reflective film is not limited to that completely prevents reflection, and can simply be one that can reduce reflection.

The optical film 81 and the anti-reflective film can be structured with a dielectric multilayer film formed by stacking various types of dielectric layers. For the dielectric layers, silicon oxide, niobium oxide, aluminum oxide, aluminum nitride, titanium oxide, tantalum oxide, or the like can be employed. A dielectric multilayer film for a specific purpose can be prepared by suitably combining these layers.

Wavelength Conversion Member 90

The wavelength conversion member 90 is a plate-like parallelepiped having a lower face, an upper face, and lateral faces. The wavelength conversion member 90 has a wavelength conversion part 91 having light transmissivity and an surrounding part 92. The wavelength conversion part 91 and the surrounding part 92 are integrally formed. The inner lateral faces of the surrounding part 92 are in contact with the lateral faces of the wavelength conversion part 91, and the outer lateral faces of the surrounding part 92 constitute the lateral faces of the wavelength conversion member 90.

The wavelength conversion part 91 is a parallelepiped. The wavelength conversion part 91 converts the light entering the wavelength conversion part 91 to light having a wavelength different from the light entered therein. The wavelength conversion member 90 can be formed by using an inorganic material as a main material that is resistant to decomposition by irradiated light. It does not have to be formed using an inorganic material.

The wavelength conversion part 91 can be formed by using a ceramic as a main material and allowing the material to contain a phosphor. The materials that can be used are not limited to these. Glass may be used as a main material, or a single-crystal phosphor may be used to form the wavelength conversion part 91.

Examples of phosphors include cerium-activated yttrium aluminum garnet (YAG), cerium-activated lutetium aluminum garnet (LAG), europium and/or chromium-activated nitrogen-containing potassium aluminosilicate ($CaO$—$Al_2O_3$—$SiO_2$), europium-activated silicate (($Sr,Ba)_2SiO_4$), α-SiAlON phosphors, β-SiAlON phosphors, and the like. Among all, a YAG phosphor that is highly heat resistant is preferably used.

The surrounding part 92 has a parallelepiped plate shape with a hole through the central part. The wavelength conversion part 91 is positioned in the through hole. The shape of the through hole corresponds to the shape of the wavelength conversion part 91 where the surrounding part 92 encloses the lateral faces of the wavelength conversion part 91.

The surrounding part 92 can be formed by using a ceramic as a main material without limitation. A metal or a ceramic-metal composite may alternatively be used. It is preferable to use a material having high thermal conductivity for the surrounding part 92 that can transfer the heat generated by the wavelength conversion part 91. The surrounding part 92 made of a highly heat conductive material has a heat dissipation function to remove the heat from the wavelength conversion part 91, and from this perspective, the surrounding part 92 can be considered as a heat dissipating member.

A material having high reflectivity that can reflect the emitted light from the semiconductor laser elements 20 and the fluorescent light from the phosphor is preferably used for the surrounding part 92. The surrounding part 92 made by using a highly reflective material as a main material has high reflectivity for the irradiated light, and from this perspective, the surrounding part 92 can be considered as a light reflecting member. Examples of highly reflective and highly thermally conductive materials include aluminum oxide.

The lower face of the wavelength conversion member 90 includes an anti-reflective film (AR film) 93, a conductive film 94, and a metal films 95. The conductive film 94 and the metal films 95 are formed on the lower face of the surrounding part 92. Moreover, the conductive film 94 and the metal films 95 are may be formed on the lower face of the surrounding part 92 via the anti-reflective film 93. The anti-reflective film 93 has characteristics similar to those of the anti-reflective film in the light transmissive member 80, and can be formed of a dielectric multilayer film.

The conductive film 94 is disposed at a position that is close to the wavelength conversion part 91. The conductive film 94 is in a line shape and is disposed so as to surround the wavelength conversion part 91 as seen from the bottom. The conductive film may extend to the bottom face of the wavelength conversion part 91. The conductive film 94 is preferably formed in a fine line shape.

A "fine line" means, for example, that the length of a portion of the line having a smaller width than the width of the wavelength conversion part 91 is longer than the perimeter of the wavelength conversion part 91 as seen from the bottom. The width of the wavelength conversion part 91 is the length of a shorter side if the periphery is a quadrilateral, and the minor diameter if the periphery is an ellipse. In the case of a shape other than the above, the width can be identified according to the same or a similar manner as these examples.

The conductive film 94 can be formed of indium tin oxide (ITO). ITO provides a high transmittance over the visible spectrum. The conductive film 94 made of ITO has transparency, and from this perspective can be considered as a light transmissive conductive film 94.

The metal films 95 are disposed in a plurality of separate regions. The metal films 95 are disposed to enclose the wavelength conversion part 91 as seen from the bottom. The two ends of the line shaped conductive film 94 are respectively linked to different metal films 95. The conductive film 94 is linked to one of the metal films 95 at one end, enclose the wavelength conversion part 91 inward of the metal film 95, and is linked to another one of the metal films 95 at the other end.

Light Shielding Member 100

The light shielding member 100 has a shape in which a through hole is created in the central portion. On the lower face side of the light shielding member 100, a projected shape is formed to enclose the through hole. In other words, on the lower face side, a recessed shape that is indented in the central portion is created.

The light shielding member 100 is formed with a resin having light shielding properties. "Light shielding properties" here refer to properties of not transmitting light, and may be achieved by utilizing properties such as absorption and reflection in addition to light shielding. For example, the light shielding member 100 can be formed of a resin that contains a filler such as a light diffuser and/or light absorbing material.

Examples of resins used to form the light shielding member 100 include epoxy resins, silicone resins, acrylate resins, urethane resins, phenol resins, BT resin, and the like. Examples of light absorbing fillers include dark color pigments such as carbon black. The light shielding member 100 may be formed of a material other than these.

Light Emitting Device 1

Next, a method of manufacturing the light emitting device 1 having the constituent elements described above will be explained.

First, two light reflecting members 40 are arranged on the bottom face 12 of the base 10. The bottom face 12 of the base 10 can be considered as an arrangement surface on which constituent elements are arranged. The two light reflecting members 40 are disposed on separate metal films with their bottom faces bonded to the bottom face 12 of the base 10. The two light reflecting members 40 are placed in a point-symmetric arrangement. Moreover, as seen from the top, the two light reflecting members 40 are such that the upper edges of the light reflecting faces 41 are parallel or perpendicular to the inner lateral faces 14 or the outer lateral faces 15 of the base 10.

Next, a protective device 50 and a temperature measuring element 60 are arranged on the bottom face 12 of the base 10. The protective device 50 is disposed on and bonded to the metal film on which one of the two light reflecting members 40 is disposed. The temperature measuring element 60 is disposed on and bonded to a metal film that is different from those on which the two light reflecting members 40 are disposed.

Next, two submounts 30 are disposed on the bottom face 12 of the base 10. The two submounts 30 are arranged on different metal films with their lower faces bonded to the bottom face 12 of the base 10. The two submounts 30 are disposed on the metal films on which the light reflecting members 40 are disposed. The submounts 30 may be disposed on different metal films from those on which the light reflecting members 40 are disposed.

Next, semiconductor laser elements 20 are disposed on the submounts 30. The two semiconductor laser elements 20 are placed on the upper faces of separate submounts 30 with the lower faces being bonded thereto. The two semiconductor laser elements are positioned in a point-symmetric arrangement. The point used for the symmetric arrangement is at the same position as that used to position the two light reflecting member 40 in a point-symmetric arrangement. This point will hereinafter be referred to as a point of symmetry.

The two semiconductor laser elements 20 as seen from the top are such that their light exiting faces are neither parallel nor perpendicular to the inner lateral faces 14 or the outer lateral faces 15 of the base 10. For this reason, the light exiting faces are not parallel or perpendicular to the upper edges of the light reflecting faces 41 either. In other words, the semiconductor laser elements 20 are arranged such that light exiting faces are oblique to the inner lateral faces 14 and the outer lateral faces 15 of the base 10 or the upper edges of the light reflecting faces 41 as seen from the top.

Instead of obliquely positioning the semiconductor laser elements 20, the light reflecting members 40 may be obliquely positioned. In other words, the semiconductor laser elements 20 may be positioned parallel or perpendicular to the inner lateral faces 14 or the outer lateral faces 15 of the base 10, while positioning the light reflecting members 40 such that the upper edges are neither parallel nor perpendicular to the inner or outer lateral faces.

The light emitted from the light exiting faces of the two semiconductor laser elements 20 irradiates the corresponding light reflecting members 40. The corresponding light reflecting member 40 is disposed on the metal film on which the corresponding semiconductor laser element 20 is disposed. The semiconductor laser elements 20 are arranged such that at least the major portion of the light irradiates the light reflecting faces 41.

Between the corresponding semiconductor laser element 20 and the corresponding light reflecting member 40, the semiconductor laser element 20 is more distant from the point of symmetry than the light reflecting member 40. Accordingly, the light emitted from the semiconductor laser elements 20 advances in the direction to approach the point of symmetry.

The temperature measuring element 60 is positioned near one of the two semiconductor laser elements 20. Because the two semiconductor laser elements 20 are symmetrically arranged, there is no large temperature difference between the two semiconductor laser elements 20. Accordingly, a light emitting device 1 can be produced with a fewer number of temperature measuring elements 60 than the number of semiconductor laser elements 20.

In the light emitting device 1, the submounts 30 on which the semiconductor laser elements 20 are disposed function as heat dissipating members to dissipate the heat generated by the semiconductor laser elements 20. A material having a higher thermal conductivity than the semiconductor laser elements 20 can be used for the submounts 30 in order to allow them to function as heat dissipating members.

The submounts 30 in the light emitting device 1 can also function of adjusting the output positions of the light from the semiconductor laser elements. For example, a submount can be used as an adjusting member in the case of making the light advancing on the optical axis being parallel to the bottom face 12 and allowing the light to irradiate a prescribed position of a light reflecting face 41.

Next, wirings 70 are disposed to electrically connect constituent elements arranged on the bottom face 12. The wirings 70, moreover, are disposed to electrically connect the metal film to the constituent elements disposed on the bottom face 12. The two semiconductor laser elements and the protective device 50 are connected in series by the wirings 70. Electrical connection of the temperature measuring element 60 is separated from the two semiconductor laser elements and the protective device 50.

Next, a light transmissive member 80 is disposed on the upper face of the base 10. The lower face of the light transmissive member 80 is disposed on and bonded to the upper face of the stepped portion 16. The light transmissive member 80 is bonded to the upper face of the first stepped portion 161. The metal film disposed in the peripheral area of the lower face of the light transmissive member 80 is bonded via Au—Sn or the like to the metal film disposed on the upper face of the first stepped portion 161.

Bonding the light transmissive member 80 to the base 10 creates a closed space in which the semiconductor laser elements 20 are disposed. In this manner, in the light emitting device 1, the light transmissive member 80 can function as a lid member. The closed space is created with hermetically sealed. Hermetically sealed space can restrain organic dusts or the like from collecting on the light exiting faces of the semiconductor laser elements 20.

Here, the light transmissive member 80 of which the upper face is bonded to a wavelength conversion member 90 is bonded to the base 10. Accordingly, the light transmissive member 80 is disposed on the upper face of the base 10, and the wavelength conversion member 90 is disposed on the upper face of the light transmissive member 80.

The light transmissive member 80 and the wavelength conversion member 90 that are bonded together are collectively referred to as an optical member 2. Manufacturing of a light transmissive member 80, a wavelength conversion member 90, and an optical member 2 will be explained in detail below.

In manufacturing a light transmissive member 80, the main body is formed using a main material. For example, using sapphire as a main material, a plate-like parallelepiped base is formed. A main body can be provided by forming or purchasing, or the like.

Next, an optical film 81 is formed on the upper face of the main body. Here, a DBR film is employed for the optical film 81 that can reflect the light converted by the wavelength conversion part 91 while transmitting the light emitted from the semiconductor laser elements 20.

The optical film 81 may be an optical film that can transmit the light converted by the wavelength conversion part 91 while reflecting the light emitted from the semiconductor laser elements 20. Alternatively, the optical film 81 may be a reflecting film that reflects both the wavelength-converted light and the emitted light from the semiconductor laser elements 20, or a light transmitting film that transmits both.

The optical film 81 is disposed on a portion of the upper face of the main body. Sputtering, photolithography, or the like can be utilized in forming the optical film 81. For example, the optical film 81 is formed by disposing a light reflecting film across the entire upper face of the main body by sputtering or vapor deposition, followed by forming a removal pattern using a photoresist on the upper face of the main body and removing the unnecessary portions of the light reflecting film.

The optical film 81 is disposed in the area that covers the wavelength conversion part 91 as seen from the top in the state in which the wavelength conversion member 90 is bonded. The optical film 81 is formed such that the thickness of the optical film 81 (film thickness), i.e., the distance from the lower face of the optical film 81 to the upper face of the optical film 81, falls within the range of 2.0 μm to 5.0 μm main body having an upper face on which an optical film 81 is formed can be provided by forming, purchasing, or the like.

Next, two metal films 82 are formed on the upper face of the main body of the light transmissive member 80 in the areas where the optical film 81 is not provided. Moreover, each metal film 81 has a wiring metal film 821 and a bonding metal film 822. The bonding metal film 822 is provided after providing the wiring metal film 821.

The wiring metal film 821 is for providing the area for disposing the wiring 70. The wiring metal film 821 can be formed of Ti/Pt/Au (a metal film made by successively stacking Ti, Pt, and Au in that order). The materials for forming the wiring metal film 821 are not limited to these. For example, Ni or Cr can be used in place of Ti, and Ru can be used in place of Pt.

The bonding metal film 822 is for bonding with the wavelength conversion member 90. The bonding metal film 822 can be formed of a metal adhesive such as Au—Sn. The materials for forming the bonding metal film 822, however, is not limited to this.

The bonding metal film 822 is disposed on the wiring metal film 821. As seen from the top, the regions where the bonding metal film 822 is disposed are surrounded by the region that has transparency except for one or more portions. At least 90% of the perimeter of the regions where the bonding metal film 822 is disposed is preferably surrounded by the region that has transparency as seen from the top. Surrounding the metal film regions with the region that has transparency makes it easier to check the condition of bonding with the wavelength conversion member 90.

The regions of the wiring metal film 821 not overlapping the bonding metal film 822 are referred to as first regions, and the regions of the wiring metal film 821 overlapping are referred to as second regions. The first region and the second region are separated from each other except for connection portion. Except for the connection portion, the first regions are disposed outward of the second regions so as to surround the second regions.

The first regions and the second regions of the wiring metal film 821 are formed in separate processes. Moreover, the film thickness of the metal film is different between the first regions and the second regions. The film thickness of the first regions of the wiring metal film 821 is larger than that of the second regions (see FIG. 13).

The wiring metal film 821 can be formed by reducing the film thickness of the second regions to one half of the film thickness of the first regions. However, in the case of forming them separately, any portion where a first region and a second region are linked, the film thickness will be the sum of the thicknesses of the first and second regions. The first regions and the second regions may be formed in one process. They may be formed to have the same film thickness.

The wiring metal film 821 is disposed such that the film thickness falls within the range of 0.3 μm to 3.5 μm in the first regions, and from 0.2 μm to 3.2 μm in the second regions. The bonding metal film 822 is disposed such that the film thickness falls within the range of 3.5 μm to 10.0 μm.

The thickness of the wiring metal film 821, furthermore, is smaller than the thickness of the optical film 81. The thickness of the wiring metal film 821 can be set to no more than one fifth of the thickness of the optical film 81. On the other hand, the thickness of the bonding metal film 822 is larger than the thickness of the optical film 81. The thickness of the bonding metal film 822 can be set to at least 1.5 times the thickness of the optical film 81.

The optical film 81 and the metal film 82 can be formed by reversing the forming sequence between forming an optical film 81 and forming a metal film 82. A main body having an upper face on which a metal film 82 or a metal film 82 and other component(s) is formed can be provided by forming, purchasing, or the like.

In manufacturing a wavelength conversion member 90, a wavelength conversion part 91 is first formed. In the case of using a ceramic as a main material for the wavelength conversion part 91, it can be formed by sintering together a phosphor and a light transmissive material such as aluminum oxide, for example. The phosphor content can be set to 0.05 percent by volume to 50 percent by volume relative to the total volume of the ceramic material. The phosphor content is not limited to these.

The wavelength conversion part 91 is formed so as to have a gas content of 1.0% at most. For example, this can be formed by sintering the material while fully removing the internal moisture under high pressure. In other words, the gas content can be adjusted by adjusting the moisture contained in the material during the sintering process. For sintering, for example, spark plasma sintering (SPS), hot press sintering (HP), or the like can be employed.

Next, the wavelength conversion part 91 is enclosed by a surrounding part 92. For example, the main body of the wavelength conversion member 90 that is an integrally sintered body of a wavelength conversion part 91 and an surrounding part 92 can be formed by integrally forming and sintering a wavelength conversion part 91 made of a formed product such as a sintered body and a powder material for forming the surrounding part 92. In the case of using a ceramic for a main material for the surrounding part 92, aluminum oxide, for example, can be used.

The surrounding part 92, furthermore, is formed so as to have a gas content of 5% to 15%. This allows the voids created in the surrounding part 92 to increase the reflectance. On the other hand, because the strength is reduced as the gas content increases, it must be balanced against the strength. In other words, the gas content does not have to be limited to this range so long as the gas content is balanced against the strength. A main body of the wavelength conversion member 90 can be provided by forming, purchasing, or the like.

v Next, an anti-reflective film 93 is formed on the lower face of the main body of the wavelength conversion member 90 that is made up of the wavelength conversion part 91 and the surrounding part 92. The anti-reflective film 93 is disposed across the entire lower face. The anti-reflective film may be disposed on a portion of the lower face, but in this case the film is disposed at least on the lower face of the wavelength conversion part 91. The anti-reflective film 93 is formed such that the thickness falls within the range of 0.05 μm to 1.0 The main body of the wavelength conversion member 90 having a lower face on which an anti-reflective film 93 is formed can be provided by forming, purchasing, or the like.

Next, a conductive film 94 is formed on the lower face of the main body of the wavelength conversion member 90. The conductive film 94 is disposed on the lower face of the main body of the wavelength conversion member 90 via the anti-reflective film 93 interposed therebetween. The conductive film may be disposed without interposing an anti-reflective film 93. The conductive film 94 is formed such that the thickness falls within the range of 0.1 μm to 1.0 μm. A main body of the wavelength conversion member 90 having a lower face on which a conductive film 94 or a conductive film 94 and other component(s) is formed can be provided by forming, purchasing, or the like.

A metal films 95 are then formed on the lower face of the main body of the wavelength conversion member 90. The metal films 95 are disposed on the lower face of the main body of the wavelength conversion member 90 via the anti-reflective film 93 interposed therebetween. In the region of the metal films 95 where it overlaps the conductive film 94, the metal films 95 is disposed while interposing the conductive film 94 with the lower face of the wavelength conversion member 90. The metal film 95 may be disposed without interposing an anti-reflective film 93. The metal films 95 is formed such that the thickness falls within the range of 0.3 μm to 3.5 μm.

A metal mask is used to form the conductive film 94, the metal film 95, and the like. A metal mask is a metal plate having opening pattern[s]. When forming a patterned metal film on the lower face of the main body of the wavelength conversion member 90, a metal mask is preferably placed on the lower face rather than a photoresist. Because the conductive film 94 and the metal film 95 are formed on the lower face of the surrounding part 92, in the case of using a material having voids such as a ceramic for forming the surrounding part 92, a photoresist would penetrate the voids that are provided for the purpose of increasing reflectance. A main body of the wavelength conversion member 90 having a lower face on which a metal film 95 or a metal film 95 and other component(s) is formed can be provided by forming, purchasing, or the like.

An optical member 2 is manufactured by bonding the upper face of the light transmissive member 80 and the lower face of the wavelength conversion member 90 formed as above. The metal films 95 disposed on the surrounding part 92 of the wavelength conversion member 90 and the metal films 82 disposed on the light transmissive member 80 are bonded via the bonding metal film 822.

Specifically, the metal films 95 of the wavelength conversion member 90 and the metal films 82 of the light transmissive member 80 are bonded via the bonding metal film 822 such that the optical film 81 is positioned directly under the wavelength conversion part 91 of the wavelength conversion member 90. Accordingly, the optical film 81 and the wavelength conversion part 91 are not directly bonded together.

The metal film 95 linked to one end of the conductive film 94 and one of the two pieces of metal film 82 of the light transmissive member 80 are bonded by the bonding metal film 822, and the metal film 95 linked to the other end of the conductive film 94 and the other piece of the metal film 82 are bonded by the bonding metal film 822. This enables electrical connection using the two pieces of metal film 82 of the light transmissive member 80 as electrodes.

At this point, the bonding condition of the bonding metal film 822 can be checked from the lower face side of the light transmissive member 80. As discussed earlier, the bonding metal film 822 prior to bonding is disposed in the areas that are surrounded by the region that has transparency, and the bonding metal film 822 when bonded to the wavelength conversion member 90 spreads and oozes out into the region having transparency (see FIGS. 12 and 13). By checking this oozing condition, whether or not the members are appropriately bonded can be determined.

Furthermore, the metal film 95 of the wavelength conversion member 90, which is bonded by the bonding metal film 822, has a larger area than the bonding metal film 822 of the light transmissive member 80. As seen from the lower face side, how the bonding metal film 822 oozes out can be checked against the metal film 95 in the background. Thus, whether the metal film is well bonded with the metal film 95 can be more precisely checked.

When bonded to the wavelength conversion member 90, the light transmissive member 80 can function of removing the heat generated at the wavelength conversion part 91. In other words, the main body of the light transmissive member 80 has heat dissipation properties, and can be considered from this perspective as a heat dissipating member.

When the light transmissive member 80 and the wavelength conversion member 90 are bonded together, the two pieces of metal film 82 and the conductive film 94 are electrically connected. Because the conductive film 94 formed in a line shape surrounds the wavelength conversion part 91 in the vicinity thereof, if the wavelength conversion part 91 has an anomaly such as a crack, a crack would also occur in the conductive film 94 in response to the shock or otherwise change the electrical connection condition. Accordingly, by detecting the change (e.g., a considerable increase in the resistance value), the anomaly in the wavelength conversion part 91 can be detected. The conductive film 94 can thus be considered to be an anomaly detection element, which is a sensor to detect any anomaly in the wavelength conversion part 91.

The optical film 81 provided on the upper face of the light transmissive member 80 encloses the wavelength conversion part 91 as seen from the top. In other words, as seen from the top, the periphery of the wavelength conversion part 91 overlaps or is located inward of the periphery of the optical film 81. The optical film 81 arranged in this manner can reflect the fluorescent light advancing in the direction towards the optical film 81 to thereby effectively output upward the light the wavelength of which has been converted by the wavelength conversion part 91.

Furthermore, by not disposing the optical film 81 in the areas where the metal films 82 of the light transmissive member 80 is disposed, the bonding distance between the light transmissive member 80 and the wavelength conversion member 90 can be reduced. In other words, the distance between the upper face of the main body of the light transmissive member 80 and the upper face of the main body of the wavelength conversion member 90 can be reduced. This allows the light to be more efficiently reflected to thereby contribute to light extraction efficiency. This also increases the effect of dissipating the heat generated at the wavelength conversion part 91, thereby restraining the conversion efficiency of the wavelength conversion part 91 from declining due to heat, and increasing the light extraction efficiency.

The optical film 81 of the light transmissive member 80 is disposed so as not to overlap the metal film 95 of the wavelength conversion member 90 as seen from the top. This can stably bond the light transmissive member 80 and the wavelength conversion member 90 as the bonding metal film 822 is crushed and reduced in thickness when bonded (see FIGS. 12 and 13).

The bonding metal film 822 melts when heated, for example, wetting and spreading on the surfaces of the metal film 95 and the metal film 82. The optical film 81 being at a distance from the metal film 82 can reduce the possibility of the bonding metal film 822 adhering to the optical film 81 during bonding.

The light transmissive member 80 and the wavelength conversion member 90 can be bonded while abutting the optical film 81 of the light transmissive member 80 against the wavelength conversion member 90. By disposing the optical film 81 to overlap the conductive film 94 as seen from the top, the light transmissive member 80 and the wavelength conversion member 90 can be bonded while abutting the optical film 81 against the conductive film 94. This, as a result, can create a space between the optical film 81 and the wavelength conversion part 91, thereby increasing the reflectance achieved by the optical film 81.

The optical film 81 may be disposed so as not to overlap the conductive film 94 as seen from the top. For example, the optical film 81 can be disposed to enclose the wavelength conversion part 91 and be positioned inward of the conductive film 94 as seen from the top. In this manner, the optical film 81 will not be abutted against the conductive film 94, and at least the portion of the conductive film 94 that encloses the wavelength conversion part 91 will not be in contact with the light transmissive member 80. Accordingly, an anomaly in the wavelength conversion part 91 can be detected with high accuracy.

The upper face of the light transmissive member 80 is larger than the lower face of the wavelength conversion member 90. As seen from the top, the upper face of the light transmissive member 80 surrounds the lower face of the wavelength conversion member 90, or surrounds the wavelength conversion member 90. As seen from the top, the wiring metal film 821 in each of the two pieces of metal film 82 of the light transmissive member 80 is disposed such that the wiring metal film 82 span from the region that overlaps the lower face of the wavelength conversion member 90 with the upper face of the light transmissive member 80 to the region that does not overlap the lower face of the wavelength conversion member 90 with the upper face of the light transmissive member 80. The bonding metal film 822, as seen from the top, is not disposed in the region that does not overlap the lower face of the wavelength conversion member 90 with the upper face of the light transmissive member 80.

In the manner described above, the light transmissive member 80, the wavelength conversion member 90, and the optical member 2 are manufactured.

When the light transmissive member 80 to which the wavelength conversion member 90 is bonded is disposed on the base 10, the light emitted from the two semiconductor laser elements 20, particularly the major portions of the light, is respectively reflected by the corresponding light reflecting faces 41 of the light reflecting member 40 and passes through the light transmissive member 80 positioned above before entering the lower face of the wavelength conversion part 91.

The light that entered the wavelength conversion part 91 in part or whole is converted to light of a different wavelength by the wavelength conversion part 91. The laser light or the wavelength-converted light is output from the light emitting device 1 through the upper face of the wavelength conversion part 91. The wavelength-converted light is also reflected by the optical film 81 and output from the light emitting device 1. In other words, the upper face of the wavelength conversion part 91 serves as the light extraction face of the light emitting device 1.

In the case in which the optical film 81 is a reflecting film, i.e., a reflecting film that reflects both the light from the semiconductor laser elements 20 and the light the wavelength of which has been converted by the wavelength conversion part 91, the arrangement can be made so as to allow the light from the semiconductor laser elements 20 to enter the upper face of the wavelength conversion part 91.

Because the wavelength conversion part 91 would be readily degraded if the heat generated by wavelength conversion concentrated at a certain location, the distribution of light incident on the wavelength conversion part 91 is preferably dispersed. This can be accomplished, for example, by not allowing the high luminous intensity portions of the emitted laser light from the two semiconductor laser elements 20 to overlap.

In the light emitting device 1, the light entering the wavelength conversion part 91 is controlled to be more uniform than the light intensity distribution of the FFP by constructing the light reflecting faces 41 of the light reflecting members 40 with a plurality of reflecting faces of various angles of inclination.

Furthermore, the two light reflecting members 40 are arranged such that the light emitted from the semiconductor laser elements advancing along the respective optical axes do not pass through the center of the wavelength conversion part. In other words, the light emitted from the semiconductor laser elements advancing along the optical axes do not overlap at the surface of incidence (lower face) of the wavelength conversion part 91.

Next, wirings 70 are joined to electrically connect an anomaly detection element. The wirings 70 are joined to the metal film disposed on the second stepped portion 162 of the base 10 and the wiring metal film 821 of the metal film 82 of the light transmissive member 80.

Here, the wiring 70 for electrically connecting the semiconductor laser elements 20, the protective device 50, and the temperature measuring element 60 will be referred to as the first wiring 71 and the wiring 70 for electrically connecting the anomaly detection element will be referred to as the second wiring 72.

The six pieces of metal film on the upper face 11 of the base 10 consist of two that supply power to the semiconductor laser elements 20, two that supply power to the temperature measuring element 60, and two that supply power to the anomaly detection element. The manner in which metal film is disposed for power supply purposes is not limited to this. For example, if the light emitting device has no temperature measuring element 60 or anomaly detection element, it does not have to have the corresponding metal film. Moreover, a metal film may be used for other purposes, for example.

Next, a light shielding member 100 is formed inward of the frame defined by the upper face 11 of the base 10. The light shielding member 100 is formed by filling the gap between the base 10 and the wavelength conversion member 90. The light shielding member 100 can be formed by pouring a resin and hardening the resin by heating. Allowing the resin to penetrate the gap can achieve better light shielding properties than fitting a formed light shielding member 100. The resin does not penetrate the closed space in which the semiconductor laser elements 20 are disposed.

The light shielding member 100 is in contact with the inner lateral faces 14 that intersect the upper face 11 of the base 10, the upper faces of the stepped portions 16, the lateral faces of the light transmissive member 80, the upper face of the light transmissive member 80, and the lateral faces of the wavelength conversion member 90. The light shielding member does not reach the upper face of the wavelength conversion member 90. Even if it reaches the upper face of the surrounding part 92, it does not reach the upper face of the wavelength conversion part 91. This can restrain the light from the semiconductor laser elements 20 from leaking from any area other than the wavelength conversion part 91 (light extraction face).

The light shielding member 100 embeds the second wiring 72. In other words, as of the point that the light shielding member 100 is formed, the second wiring 72 is not exposed in the light emitting device 1. This can protect the second wiring 72 against water droplets or the like that could otherwise adhere thereto. The second wiring does not necessarily have to be embedded.

The wavelength conversion member 90 goes through the through hole created by the light shielding member 100. The projected portion formed on the lower face side of the light shielding member 100 is fitted into the groove between the lateral faces of the light transmissive member 80 and the inner lateral faces 14 of the base 10.

The light shielding member 100 hides the metal regions expose inward of the frame defined by the upper face 11 of the base 10 as seen from the top. In the light emitting device 1, the light shielding member 100 is formed with an insulation material, functioning as an insulator. This can limit the conductive regions for powering the light emitting device 1 by an external power supply to the areas outward of the recessed space.

Second Embodiment

Figure 14:
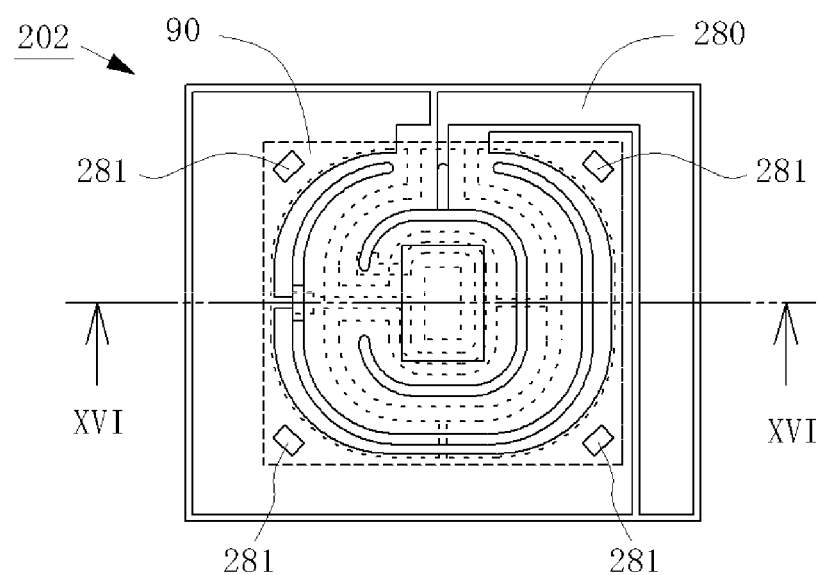
FIG. 14 is a diagram of a light emitting device according to a second embodiment explaining the interface between the light transmissive member and the wavelength conversion member as seen through the wavelength conversion member.
Figure 15:
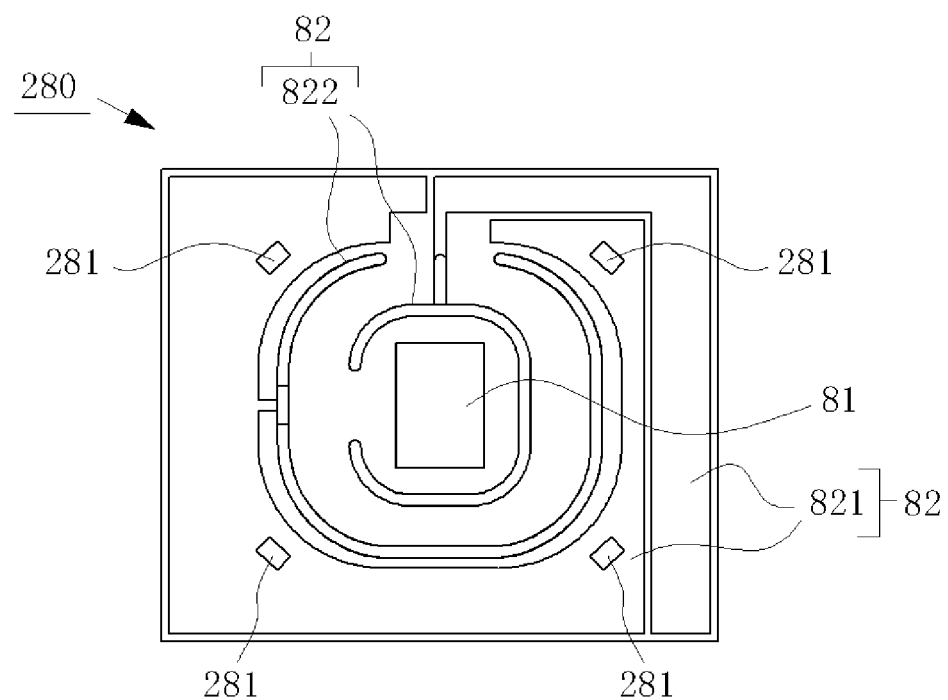
FIG. 15 is a top view of the light transmissive member according to the second embodiment.
Figure 16:
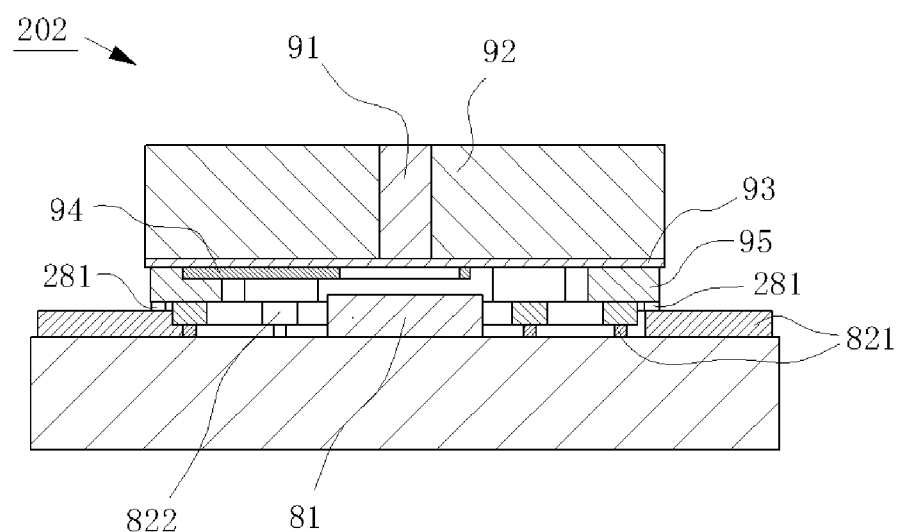
FIG. 16 is a cross-sectional view of the optical member taken along line XVI-XVI in FIG. 14.
Figure 17:
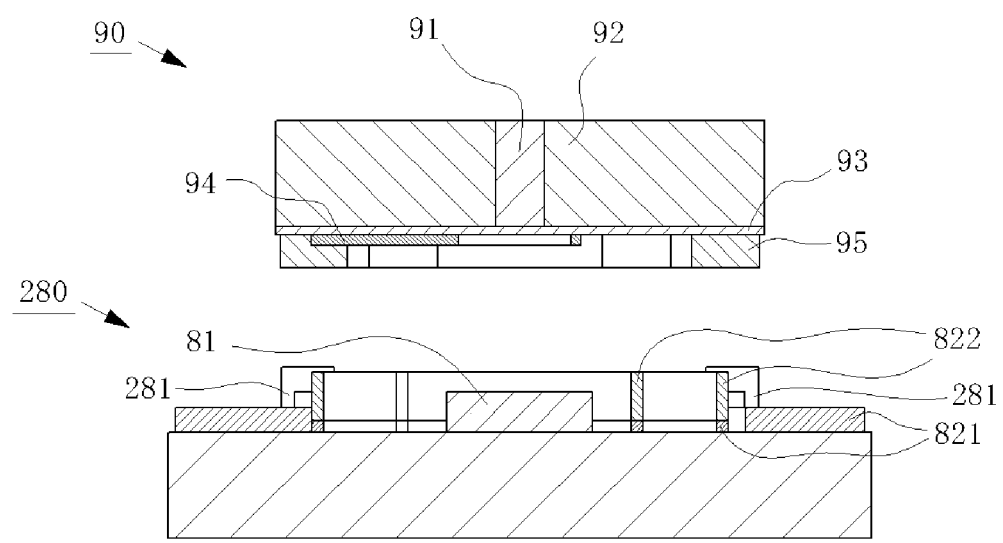
FIG. 17 is a cross-sectional view corresponding to FIG. 14 showing the state prior to bonding the light transmissive member and the wavelength conversion member.

Next, a light emitting device according to a second embodiment will be explained. FIG. 14 is a diagram of a light emitting device according to the second embodiment explaining the interface between the light transmissive member 280 and the wavelength conversion member 90 as seen through the wavelength conversion member 90. FIG. 15 is a top view of the light transmissive member 280. FIG. 16 is a cross-sectional view of the optical member 202 taken along line XVI-XVI in FIG. 14. FIG. 17 is a cross-sectional view showing the state prior to bonding the light transmissive member 280 and the wavelength conversion member 90.

The light emitting device according to the second embodiment differs from the light emitting device 1 according to the first embodiment such that the light transmissive member 280 has a supporting part 281. For the other parts of the construction, those similar to the parts used in the light emitting device 1 according to the first embodiment can be employed.

Light Transmissive Member 280

The light transmissive member 280 has a supporting part 281. Alternatively, the light transmissive member 280 may have a plurality of supporting parts 281. The one or more supporting parts 281 are disposed on the upper face side of the light transmissive member 280. The one or more supporting parts 281 and the optical film 81 are disposed on the same face side.

The plurality of supporting parts 291 have the same shape. They may have different shapes so long as the height from the upper face to the lower face is the same. The plurality of supporting parts 281 include two supporting parts 281 such that an imaginary line connecting the two at any point in each traverses the bonding metal film 822 as seen from the top.

Alternatively, the plurality of supporting parts 281 include two supporting parts 281 such that an imaginary line connecting the two at any point in each traverses the optical film 81 as seen from the top. Alternatively, the plurality of supporting parts 281 include two supporting parts 281 such that an imaginary line connecting the two at any point in each traverses both the bonding metal film 822 and the optical film 81 as seen from the top.

Instead of two supporting parts 281, a single supporting part 281 may be provided to satisfy one of these conditions. In this case, an imaginary line connecting two points in the supporting part 281 would satisfy one of these conditions. Accordingly, the one or more supporting parts 281 are disposed in the position(s) such that an imaginary line connecting two points in the region or regions where they are disposed traverses the bonding metal film 822, the optical film 81, or both the bonding metal film 822 and the optical film 81.

Alternatively, the plurality of supporting parts 281 include four supporting parts 281 such that an imaginary line traversing two of the four supporting parts 281 intersects with an imaginary line traversing the other two supporting parts 281 in the region where the optical film 81 is located as seen from the top. This condition may similarly be satisfied by a single supporting part 281.

In the light transmissive member 280, the one or more supporting parts 281 are disposed in a region(s) that are different from the regions where the bonding metal films 822 are disposed. In other words, no supporting parts 281 are disposed in the regions where the bonding metal films 822 are disposed.

In the light transmissive member 280, moreover, the one or more supporting parts 281 are disposed in the regions where the wiring metal films 821 are disposed, but the bonding metal film 822 is absent. For example, the one or more supporting parts 281 are disposed in the first regions of the wiring metal films 821.

Moreover, the one or more supporting parts 281 are disposed in the position(s) more distant from the optical film 81 than the bonding metal film 822. In other words, the supporting parts 281 are disposed in the positions that are not traversed by a line segment of any straight line connecting any point in the optical film 81 and any point in the bonding metal film 822. The light transmissive member may have a supporting part 281 disposed in a position closer to the optical film 81 than the bonding metal film 822.

The supporting parts 281 can be formed at the same time the optical film 81 is formed. For example, when forming an optical film 81 by partially removing the light reflecting film disposed across the entire upper face of the base of the light transmissive member 280, the light reflecting film is allowed to also remain in the regions where supporting parts 281 will be formed. The supporting parts 281 are formed by disposing a metal film 82 on the light reflecting film remaining in the regions of the supporting parts 281.

The method of forming the supporting parts 281 is not limited to this. For example, the supporting parts may be formed on the metal film 82 disposed on the upper face of the base.

Light Emitting Device

The light emitting device according to the second embodiment has an optical member 202 in which a light transmissive member 280 and a wavelength conversion member 90 are bonded together. The optical member 202 can be mounted in a similar manner to that in the light emitting device 1 according to the first embodiment.

In the optical member 202, the one or more supporting parts 281 of the light transmissive member 280 are disposed in the positions where the wavelength conversion member 90 overlaps as seen from the top. The one or more supporting parts 281 are not disposed outward of the wavelength conversion member 90 as seen from the top. Accordingly, the one or more supporting parts 281 are not exposed as seen from the top.

Moreover, the one or more supporting parts 281 are disposed in the positions where the conductive film 94 of the wavelength conversion member 90 does not overlap as seen from the top. The one or more supporting parts 281 are disposed in the position(s) where the metal films 95 of the wavelength conversion member 90 do not overlap as seen from the top.

The one or more supporting parts 281 are disposed in the position(s) where the regions of insulation in the wavelength conversion member 90 overlap as seen from the top. The one or more supporting parts 281 are disposed in the position(s) where the anti-reflective film 93 of the wavelength conversion member 90 overlaps as seen from the top. Disposing them in such positions can avoid unintended electrical conduction even when the supporting parts 281 are formed with a conductive material.

The upper face(s) of the one or more supporting parts 281 are positioned higher than the lower face of the conductive film 94. The upper face(s) of the one or more supporting parts 281 are positioned higher than the lower face of the metal film 95. This can position the optical film 81 closer to the wavelength conversion member 91 as compared to the case in which the supporting parts 281 are in contact with the conductive film 94 or the metal film 95, thereby increasing the light extraction efficiency.

Providing the light transmissive member 280 with the one or more supporting parts 281 can reduce variations in the distance from the optical film 81 to the wavelength conversion member 91 when bonding the wavelength conversion member 90 and the light transmissive member 280 together. The bonding metal film 822 is compressed during bonding, but even if the degree of that varies, the distance between the light transmissive member 280 and the wavelength conversion member 90 would not become smaller past the position at which the supporting parts 281 come into contact with the wavelength conversion member 90. The reduced distance variation can reduce variations in the color of light being output from the wavelength conversion part 91.

In the foregoing, embodiments of the present disclosure have been described. However, the present invention is not limited to the embodiments described above. For example, the present disclosure is applicable to a device having elements not included in any of the embodiments. As such, the mere fact that there is a difference from the disclosed embodiments would not provide any ground for the inapplicability of the present invention.

Further, the present invention may be applicable to a device even if the device does not include all of the constituent elements of the light emitting devices of the embodiments described above. For example, in the event that a certain constituent element of a light emitting device included in any of the embodiments is not recited in the claim, the claim may still apply based on design flexibility that would be recognized by a person of ordinary skill in the art through the use of an alternative, an omission, a shape change, a change in the materials employed, or the like.

The light emitting devices disclosed in the embodiments can be used as light sources for automotive headlights, lighting fixtures, projectors, backlights or the like for head-mounted displays and other displays.

What is claimed is:

1. An optical member comprising:
   a main body having transparency or heat dissipation properties;
   an optical film disposed on an upper face of the main body;
   a metal film disposed on the upper face of the main body in a region other than a region where the optical film is disposed;
   a surrounding part joined via the metal film; and
   a wavelength conversion part surrounded by the surrounding part,
   wherein the wavelength conversion part is positioned inward of a periphery of the optical film in a top view, and
   wherein the wavelength conversion part is not directly bonded to the optical film and the main body.

2. The optical member according to claim 1, wherein:
   the main body comprises sapphire as a main material.

3. The optical member according to claim 1, wherein:
   the optical film is configured to reflect light having a specific wavelength and transmit light having other wavelengths.

4. The optical member according to claim 3, wherein:
   the optical film is a DBR film.

5. The optical member according to claim 1, wherein:
   a thickness of the optical film is within a range of 2.0 µm to 5.0 µm.

6. The optical member according to claim 3, further comprising:
   an anti-reflective film disposed on a lower face of the wavelength conversion part.

7. The optical member according to claim 6, wherein:
   a thickness of the optical film is larger than a thickness of the anti-reflective film.

8. The optical member according to claim 1, further comprising:
   a conductive film disposed on a lower face of the surrounding part at a position that is close to the wavelength conversion part and linked to the metal film.

9. The optical member according to claim 8, wherein:
   a thickness of the optical film is larger than a thickness of the conductive film.

10. The optical member according to claim 1, wherein:
    the upper face of the main body surrounds a lower face of the surrounding part in a top view.

11. The optical member according to claim 1, wherein:
    the optical film is disposed so as not to overlap the metal film in a top view.

12. The optical member according to claim 1, further comprising:
    one or more supporting parts disposed on the main body in positions overlapped by the surrounding part in a top view.

13. The optical member according to claim 12, wherein:
    the one or more supporting parts are disposed in positions such that an imaginary line connecting two points in regions at which the one or more supporting parts are disposed traverses the optical film in a top view.

14. The optical member according to claim 12, wherein:
the one or more supporting parts include two supporting parts such that an imaginary line connecting the two supporting parts at any point in each traverses the optical film in a top view.

15. The optical member according to claim 8, further comprising:
one or more supporting parts disposed on the main body in positions overlapped by the surrounding part in a top view, wherein an upper face of each of the one or more supporting parts is positioned higher than a lower face of the conductive film.

16. A light emitting device comprising:
a semiconductor laser element; and
the optical member according to claim 1,
wherein the optical member is configured to receive light emitted from the semiconductor laser element.

\* \* \* \* \*